United States Patent
Jang et al.

(10) Patent No.: US 10,773,427 B2
(45) Date of Patent: Sep. 15, 2020

(54) ROLL TYPE IMPRINT MASTER MOLD, METHOD OF MANUFACTURING THE SAME, AND IMPRINT METHOD USING THE SAME

(71) Applicant: Samsung Display Co., Ltd., Yongin-si (KR)

(72) Inventors: Daehwan Jang, Seoul (KR); Seung-Won Park, Seoul (KR); Baehyoun Jung, Seongnam-si (KR); Eunjung Kim, Suwon-si (KR); Jihun Kim, Hwaseong-si (KR); Yunjong Yeo, Seoul (KR); Hyungbin Cho, Seongnam-si (KR); Sang-Hoon Lee, Cheonan-si (KR); Yong-Hwan Ryu, Cheonan-si (KR); Sung-Young Choi, Hwaseong-si (KR); Hyunju Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 293 days.

(21) Appl. No.: 15/652,184

(22) Filed: Jul. 17, 2017

(65) Prior Publication Data

US 2018/0021985 A1 Jan. 25, 2018

(30) Foreign Application Priority Data

Jul. 19, 2016 (KR) ........................ 10-2016-0091130

(51) Int. Cl.
*B29C 33/42* (2006.01)
*B29C 33/38* (2006.01)
(Continued)

(52) U.S. Cl.
CPC ........ *B29C 33/428* (2013.01); *B29C 33/3807* (2013.01); *B29C 33/3842* (2013.01);
(Continued)

(58) Field of Classification Search
CPC .............. B29C 33/3087; B29C 59/046; B29C 33/3842; B29C 2035/0827; G02B 5/00; G03F 7/0035
See application file for complete search history.

(56) References Cited

U.S. PATENT DOCUMENTS

| 10,281,817 B2 * | 5/2019 | Kim ...................... G03F 7/0002 |
| 2009/0189306 A1 * | 7/2009 | Terasaki ................. B82Y 10/00 |
| | | 264/238 |

(Continued)

FOREIGN PATENT DOCUMENTS

| KR | 10-1444604 | 9/2014 |
| KR | 10-2015-0095971 | 8/2015 |

*Primary Examiner* — Alison L Hindenlang
*Assistant Examiner* — Debjani Roy
(74) *Attorney, Agent, or Firm* — H.C. Park & Associates, PLC (57) ABSTRACT

A method of manufacturing a roll type imprint master mold including disposing a base layer on a substrate including a first area and a second area adjacent to the first area, disposing an inorganic insulation layer on the base layer, forming a first mask pattern and a first resin pattern in the first area, forming a pattern layer by etching the inorganic insulation layer using the first resin and the first mask patterns as a mask, removing the first resin and the first mask patterns, forming a second mask pattern and a second resin pattern in the second area, forming a pattern layer by etching the inorganic insulation layer using the second resin and the second mask patterns as a mask, removing the second resin and the second mask patterns, separating the base layer from the substrate, and attaching the base layer onto a roll body.

9 Claims, 12 Drawing Sheets

(51) Int. Cl.
*G03F 7/00* (2006.01)
*B29C 35/08* (2006.01)
*B29C 59/04* (2006.01)

(52) U.S. Cl.
CPC .......... *B29C 33/424* (2013.01); *G03F 7/0002* (2013.01); *B29C 59/046* (2013.01); *B29C 2035/0827* (2013.01); *B29K 2845/00* (2013.01)

(56) References Cited

U.S. PATENT DOCUMENTS

| | | | |
|---|---|---|---|
| 2011/0042352 A1* | 2/2011 | Okushima | B29C 33/424 216/44 |
| 2011/0064871 A1* | 3/2011 | Uchida | B29C 33/3842 427/130 |
| 2012/0328728 A1* | 12/2012 | Nakatsuka | B29C 33/3842 425/385 |
| 2014/0017614 A1* | 1/2014 | Schaper | G03F 7/0035 430/323 |
| 2015/0132477 A1 | 5/2015 | Seong et al. | |
| 2015/0224704 A1 | 8/2015 | Cho et al. | |
| 2017/0227696 A1* | 8/2017 | Ookawa | G02B 5/3058 |
| 2019/0193305 A1* | 6/2019 | Shibata | B29C 33/3842 |

\* cited by examiner

ROLL TYPE IMPRINT MASTER MOLD, METHOD OF MANUFACTURING THE SAME, AND IMPRINT METHOD USING THE SAME

CROSS-REFERENCE TO RELATED APPLICATION

This application claims priority from and the benefit of Korean Patent Application No. 10-2016-0091130, filed on Jul. 19, 2016, which is hereby incorporated by reference for all purposes as if fully set forth herein.

BACKGROUND

Field

Exemplary embodiments relate to a roll type imprint master mold, a method of manufacturing the roll type imprint master mold, and an imprint method using the roll type imprint master mold. More particularly, exemplary embodiments relate to a roll type imprint master mold for manufacturing a wire grid polarizer, a method of manufacturing the same, and an imprint method using the same.

Discussion of the Background

Recently, a display apparatus having light weight and small size has been manufactured. A cathode ray tube (CRT) display apparatus has a competitive performance and a competitive price. However the CRT display apparatus has a weakness in size and portability. Therefore, a display apparatus such as a plasma display apparatus, a liquid crystal display apparatus and an organic light emitting display apparatus has been used where small size, light weight, and low-power-consumption are required.

The display apparatus may include a polarizer. The polarizer may be a wire grid polarizer which is formed by an imprint process. As the display device becomes larger, it is difficult to improve the yield of the imprint process.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a roll type imprint master mold having an improved process yield for a large area imprint process.

Exemplary embodiments provide a method of manufacturing the roll type imprint master mold.

Exemplary embodiments provide an imprint method using the roll type imprint master mold.

Additional aspects will be set forth in the detailed description which follows, and, in part, will be apparent from the disclosure, or may be learned by practice of the inventive concept.

According to exemplary embodiments, a roll type imprint master mold may include a roll body having a cylindrical shape extending in a first direction, a base layer disposed on the roll body to cover a surface of the roll body, and a pattern layer disposed on the base layer, the pattern layer including an inorganic insulation material.

The pattern layer may include a wire grid polarizer pattern including a plurality of fine protrusions arranged in the first direction at a regular interval, wherein each of the fine protrusions may have a width in the first direction and extend along the base layer perpendicular to the first direction.

A pitch of the wire grid pattern may be from about 50 nm to about 150 nm.

The inorganic insulation material may include at least one selected from a group consisting of a silicon oxide (SiOx), silcononitrile (SiNx), and silicon oxynitride (SiON).

The base layer may include polyimide (PI) or polyamide (PA).

The base layer may include a transparent material, and the surface of the roll body may be formed of a metal, on which the base layer is disposed.

The roll type imprint master mold may further include an adhesive layer disposed between the base layer and the roll body.

According to exemplary embodiments, a method of manufacturing a roll type imprint master mold may include: disposing a base layer on a substrate, the substrate including a first area and a second area adjacent to the first area, disposing an inorganic insulation layer on the base layer, forming a first mask pattern on the inorganic insulation layer in the second area, forming a first resin pattern on the inorganic insulation layer in the first area, forming a pattern layer in the first area by etching the inorganic insulation layer using the first resin pattern and the first mask pattern as a mask, removing the first resin pattern and the first mask pattern, forming a second mask pattern on the inorganic insulation layer in the first area, forming a second resin pattern on the inorganic insulation layer in the second area, forming a pattern layer in the second area by etching the inorganic insulation layer using the second resin pattern and the second mask pattern as a mask, removing the second resin pattern and the second mask pattern, separating the base layer from the substrate, and attaching the base layer on which the pattern layer is formed onto a roll body having a cylindrical shape.

The forming of the first resin pattern may include disposing a first resin layer on the inorganic insulation layer in the first area, and forming the first resin pattern from the first resin layer using an imprint mold.

The forming of the first mask pattern may include disposing a first mask layer on the inorganic insulation layer, disposing a first photoresist pattern on the first mask layer in the second area, and removing a portion of the first mask layer corresponding to the first area by etching the first mask layer using the first photoresist pattern as a mask.

The forming of the second resin pattern may include disposing a second resin layer on the inorganic insulation layer in the second area, and forming the second resin pattern from the second resin layer using the imprint mold.

The forming of the second mask pattern may include disposing a second mask layer on the inorganic insulation layer, disposing a second photoresist pattern on the second mask layer in the first area, and removing a portion of the second mask layer corresponding to the second area by etching the second mask layer using the second photoresist pattern as a mask.

The attaching of the base layer may include attaching the base layer onto an adhesive layer between the roll body and the base layer.

The inorganic insulation material may include at least one selected from a group consisting of a silicon oxide (SiOx), silcononitrile (SiNx), and silicon oxynitride (SiON).

The base layer may include polyimide (PI) or polyamide (PA).

The base layer may include a transparent material, and a surface of the roll body is formed of a metal, on which the base layer is disposed.

According to exemplary embodiments, an imprint method may include disposing a first layer on a substrate, forming an imprint resin layer on the first layer, and forming an imprint resin pattern from the imprint resin layer using a roll type imprint master mold, wherein the roll type imprint master mold may include a roll body having a cylindrical shape extending in a first direction, a base layer disposed on the roll body to cover a surface of the roll body, and a pattern layer disposed on the base layer, the pattern layer including an inorganic insulation material.

The forming the imprint resin pattern may include radiating an ultraviolet ray to a portion where the roll type imprint master mold makes contact to the imprint resin layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, the exemplary embodiments of inventive concepts will be explained in detail with reference to the accompanying drawings.

Figure 1:
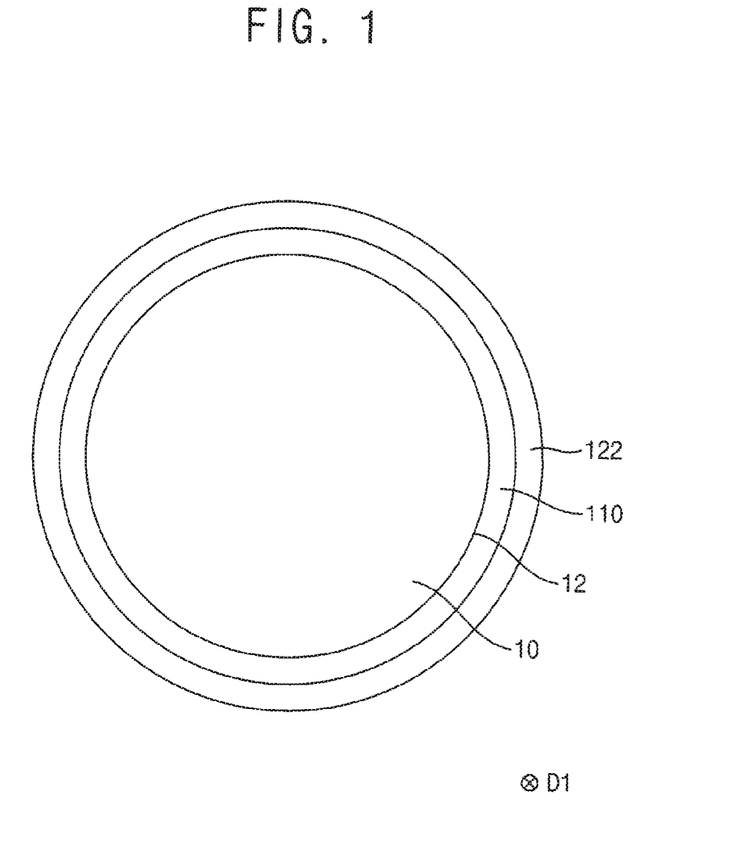
FIG. 1 is a cross-sectional view of a roll type imprint master mold, according to an exemplary embodiment.
Figure 2:
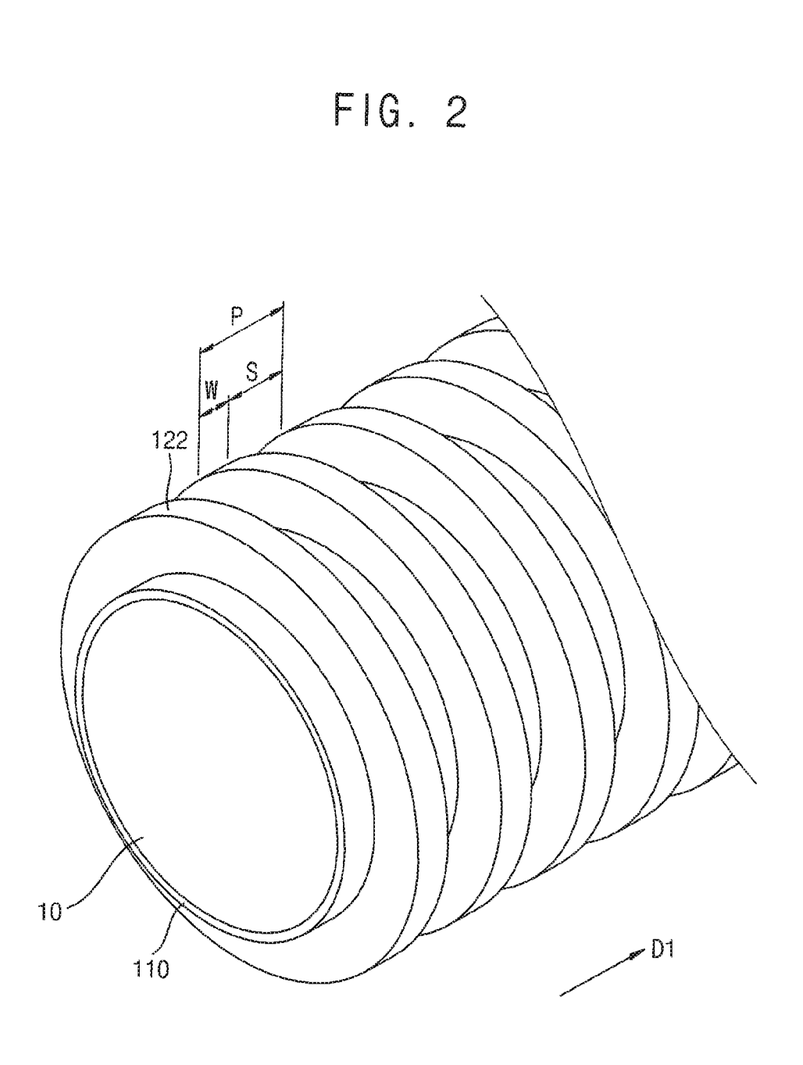
FIG. 2 is a perspective view illustrating a portion of the roll type imprint master mold of FIG. 1.

FIG. 1 is a cross-sectional view of a roll type imprint master mold, according to an exemplary embodiment. FIG. 2 is a perspective view illustrating a portion of the roll type imprint master mold of FIG. 1.

Referring to FIGS. 1 and 2, the roll type imprint master mold may include a roll body 10, a base layer 110 and a pattern layer 122. The roll type imprint master mold may be used for forming a wire grid polarizer of a display apparatus.

The roll body 10 may have a cylindrical shape extending in a first direction D1. A base layer 110 may be disposed on a surface 12 of the roll body 10. The base layer 110 may cover the roll body 10. The surface 12 of the roll body 10 may be formed of a metal having high reflectance such as aluminum.

The base layer 110 may be a flexible transparent resin layer. For example, the base layer 110 may include at least one of polyimide (PI), polyamide (PA), and the like.

The pattern layer 122 may be disposed on the base layer 110. The pattern layer 122 may include a plurality of fine protrusions to form a wire grid pattern. Thus, the pattern layer 122 may have a wire grid polarizer pattern which includes the plurality of fine protrusions arranged in the first direction D1 at regular intervals. Each of the fine protrusion may have a width in the first direction D1, and extend along the base layer 110 and perpendicular to the first direction D1.

For example, the fine protrusions may have a pitch P about 50 nm (nanometers) to about 150 nm. The pitch P may be defined as sum of a width W of one of the fine protrusion and a distance S between the fine protrusions disposed adjacent to each other (P=W+S). The fine protrusion may extend along a circumferential direction of the roll body 10. Thus, the fine protrusion may extend in a direction which is perpendicular to the first direction D1, and have the width W in the first direction D1.

The pattern layer 122 may include a transparent inorganic insulation layer. For example, the pattern layer 122 may include at least one of silicon oxide (SiOx), silcononitrile (SiNx), silicon oxynitride (SiON), etc.

An adhesive layer may be further disposed between the base layer 110 and the surface 12 of the roll body 10, so that the base layer 110 on which the pattern layer 122 is disposed may be attached and fixed on the surface 12 of the roll body 10. The adhesive layer may be transparent for passing ultraviolet ray.

FIGS. 3A, 3B, 3C, 3D, 3E, 3F, 3G, 3H, 3I, 3J, 3K, 3L, 3M, 3N, 3O, 3P and 3Q are cross-sectional views illustrating a method of manufacturing the roll type imprint master mold of FIG. 1, according to an exemplary embodiment. FIGS. 4A and 4B are plan views illustrating the method of manufacturing the roll type imprint master mold of FIG. 1, according to an exemplary embodiment.

Figure 3A:
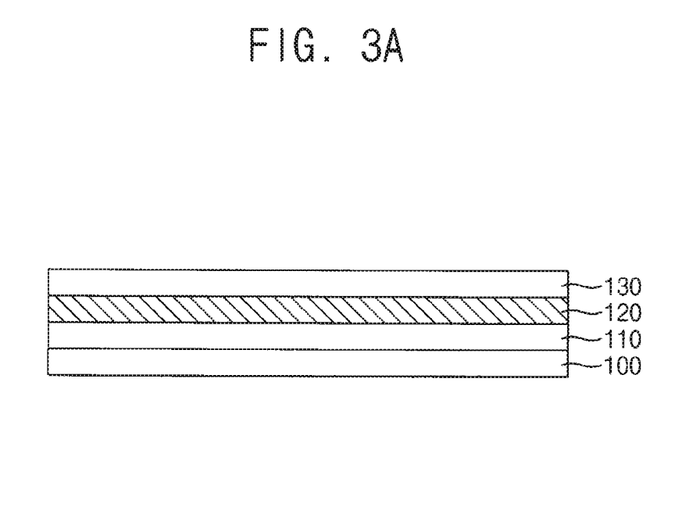
FIGS. 3A, 3B, 3C, 3D, 3E, 3F, 3G, 3H, 3I, 3J, 3K, 3L, 3M, 3N, 3O, 3P, and 3Q are cross-sectional views illustrating a method of manufacturing the roll type imprint master mold of FIG. 1, according to an exemplary embodiment.
Figure 4A:
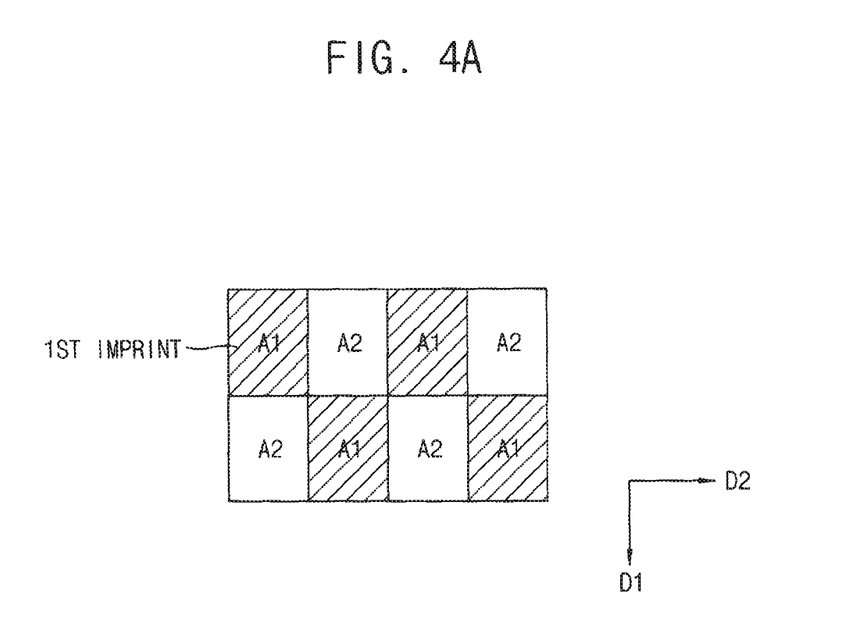
FIGS. 4A and 4B are plan views illustrating the method of manufacturing the roll type imprint master mold of FIG. 1, according to an exemplary embodiment.
Figure 4B:
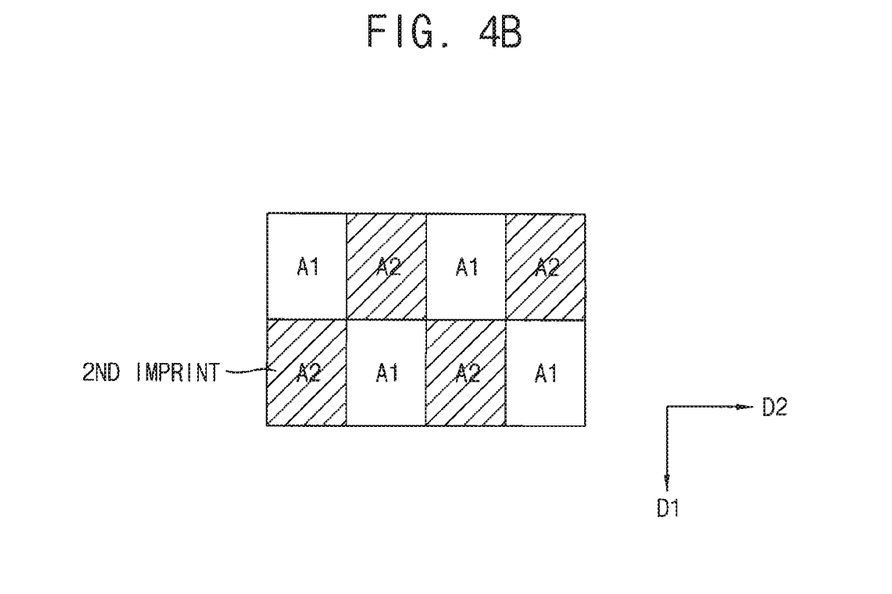

Referring to FIG. 3A, a base layer 110 may be disposed on a substrate 100. The base layer 110 may include a flexible transparent resin. The base layer 110 may be formed by curing a transparent resin after coating the transparent resin on the substrate 100.

For example, polyimide or polyamide may be coated on the substrate 100, and then the coated polyimide or polyamide may be cured to form the base layer 110.

A preliminary pattern layer 120 may be disposed on the base layer 110. The preliminary pattern layer 120 may include a transparent inorganic insulation layer. For example, the preliminary pattern layer 120 may include at least one of silicon oxide (SiOx), silcononitrile (SiNx), silicon oxynitride (SiON), etc.

A first mask layer 130 may be disposed on the preliminary pattern layer 120. The first mask layer 130 may include a metal. For example, the first mask layer 130 may include at least one of aluminum (Al), molybdenum (Mo), etc.

Figure 3B:
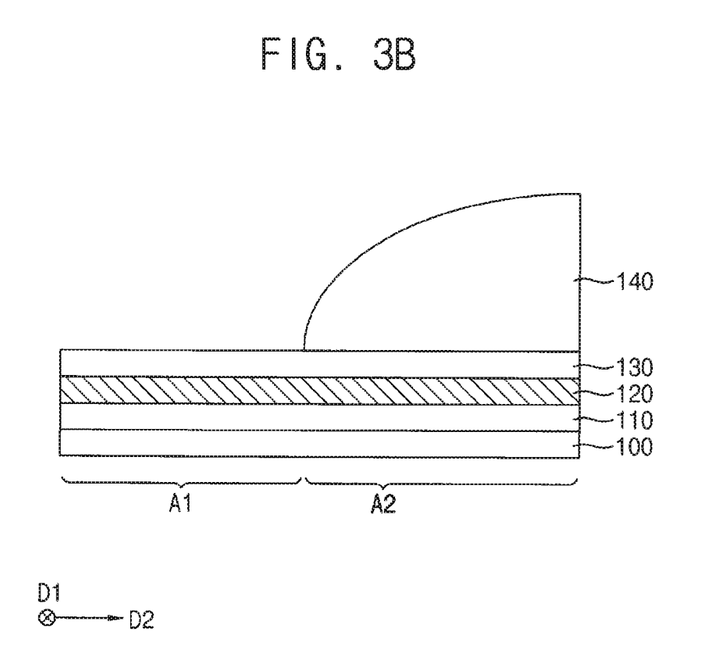

Referring to FIGS. 3B, 4A and 4B, the substrate 100 may include a plurality of first areas A1 and a plurality of second areas A2. The first area A1 and the second area A2 may be alternately arranged in a second direction D2 on the substrate 100. The second direction D2 is perpendicular to the first direction D1. A first photoresist pattern 140 may be disposed on the first mask layer 130 in the second area A2.

Referring to FIGS. 4A and 4B, a pattern layer in the first area A1 may be formed by a first imprint lithography process (refer to 1ST IMPRINT of FIG. 4A), and a pattern layer in the second area A2 may be formed by a second imprint lithography process (refer to 2ND IMPRINT of FIG. 4B). Hereinafter, a detailed method will be described.

Figure 3C:
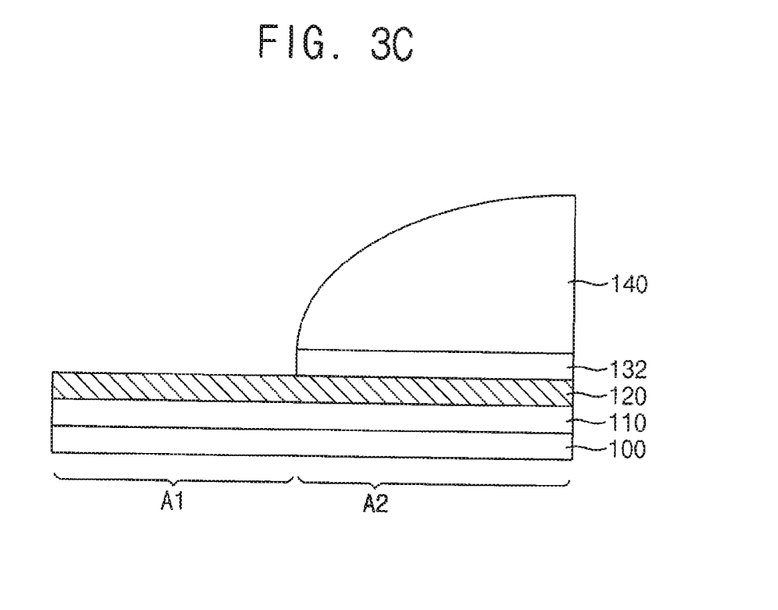

Referring to FIG. 3C, using the first photoresist pattern 140, a first mask pattern 132 may be formed by patterning the first mask layer 130. Accordingly, the first layer 120 may be exposed in the first area A1, and the first layer 120 may be covered by the first mask pattern 132 in the second area A2.

Figure 3D:
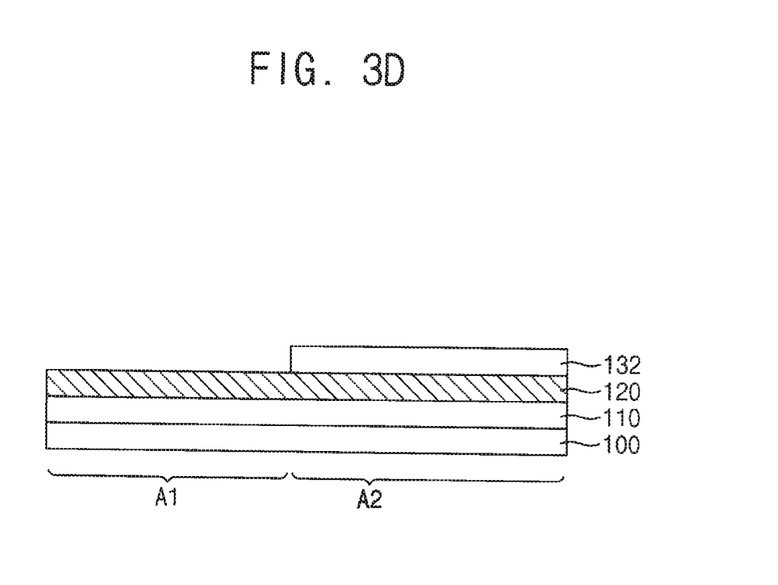

Referring to FIG. 3D, the first photoresist pattern 140 may be removed.

Figure 3E:
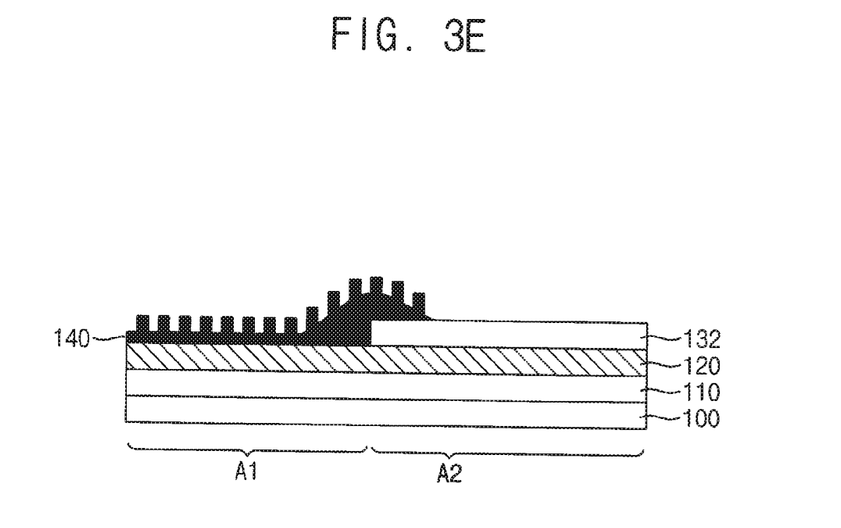

Referring to FIG. 3E, a preliminary first resin pattern 140 may be disposed in the first area A1. The preliminary first resin pattern 140 may be further disposed in at least a portion of the second area A2 adjacent to the first area A1. Thus, the preliminary first resin pattern 140 may also be disposed on the first mask pattern 132 in an edge portion of the second area A2 adjacent to the first area A1.

A resin layer may be disposed on the first layer 120 in the first area A1. And then, the resin layer may be pressed by an imprint mold. And then, the resin layer may be cured to form the preliminary first resin pattern 140. The imprint mold may be formed on or of a wafer. The imprint mold may have protrusion patterns may have a shape and a arrangement having a regular interval to form a wire grid polarizer pattern. The protrusion patterns may have a pitch about 50 nm to about 150 nm. The pitch may be defined as sum of width of one of the protrusion pattern and a distance between two adjacent protrusion patterns.

Figure 3F:
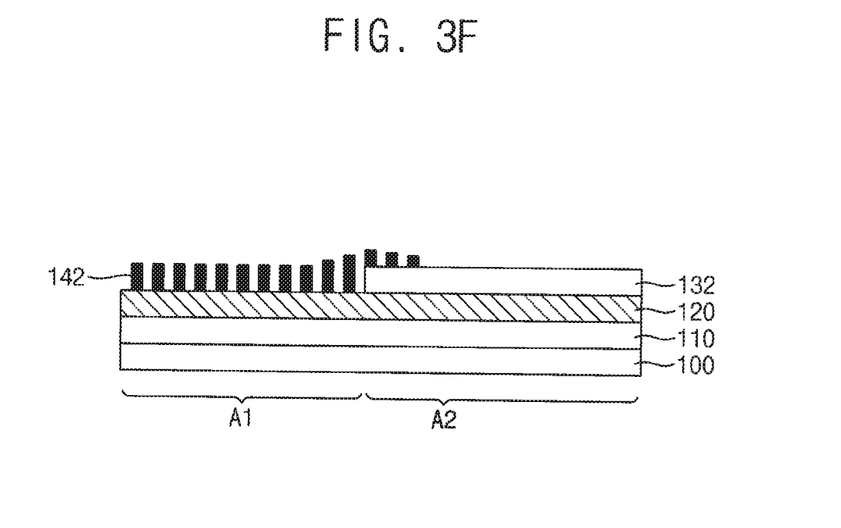

Referring to FIG. 3F, a residual layer of the preliminary first resin pattern 140 may be removed to form a first resin pattern 142. For example, the preliminary first resin pattern 140 may be wet etched or dry etched to remove the residual layer.

Figure 3G:
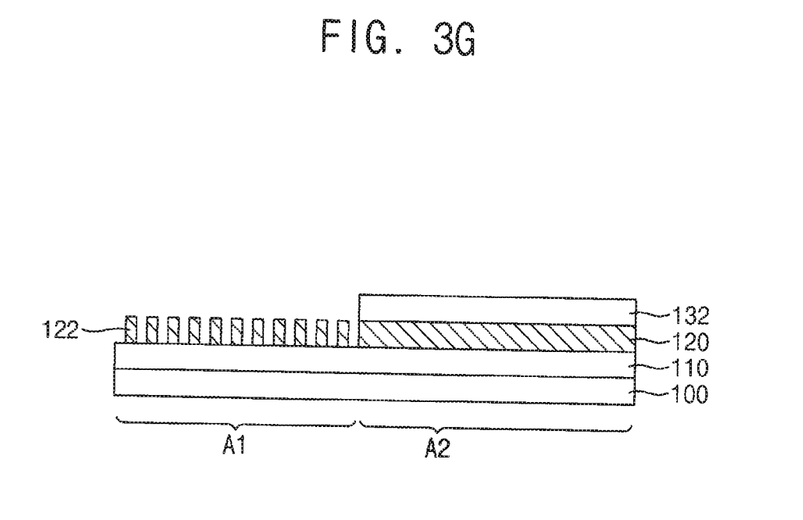

Referring to FIG. 3G, the first layer 120 may be patterned using the first mask pattern 132 and the first resin pattern 142. For example, using the first mask pattern 132 and the first resin pattern 142 as an etching barrier, the first layer 120 may be etched. Accordingly, a pattern layer 122 may be disposed in the first area A1.

And then, remaining portions of the first resin pattern 142 may be removed.

Figure 3H:
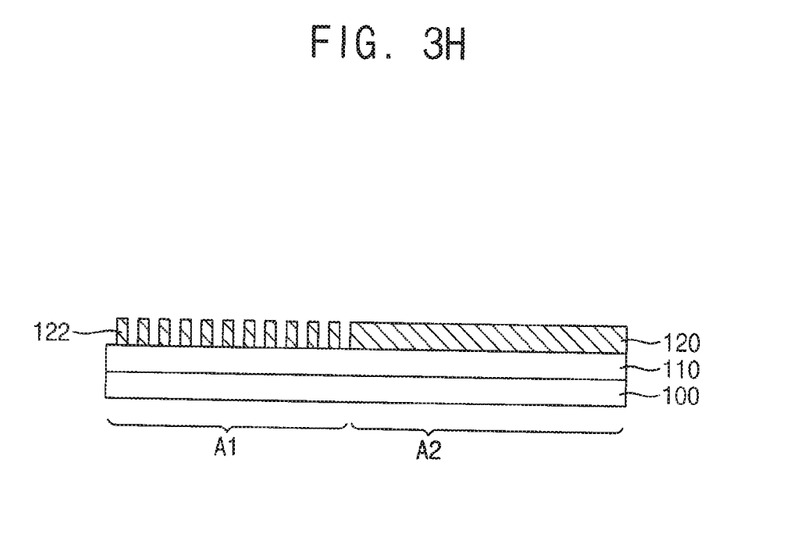

Referring to FIG. 3H, the first mask pattern 132 may be removed. Accordingly, the first layer 120 may be exposed.

Figure 3I:
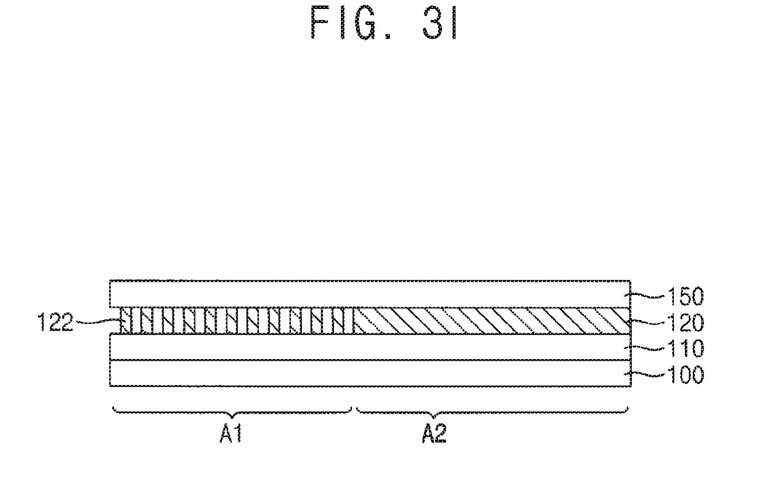

Referring to FIG. 3I, a second mask layer 150 may be disposed on the pattern layer 122 and the first layer 120 in the first area A1 and the second area A2. The second mask layer 150 may include a metal. For example, the second mask layer 150 may include at least one of aluminum (Al), molybdenum (Mo), etc.

Figure 3J:
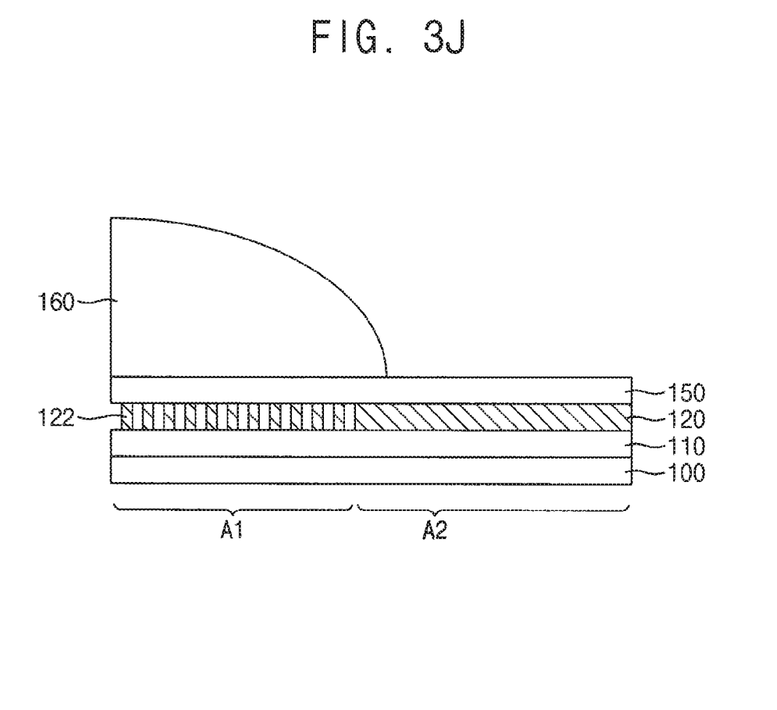

Referring to FIG. 3J, a second photoresist pattern 160 may be disposed on the second mask layer 150 in the first area A1. Here, the photoresist pattern 160 may be disposed corresponding to the first area A1, and not disposed in the second area A2. According to accuracy of a photo process, the second photoresist pattern 160 may be disposed in a portion of the second area A2, or a portion of the first area A1 not be filled with the photoresist pattern 160. However, such a formation error of the pattern layer 122 according to the photo process may be imperceptible to the human eye.

Figure 3K:
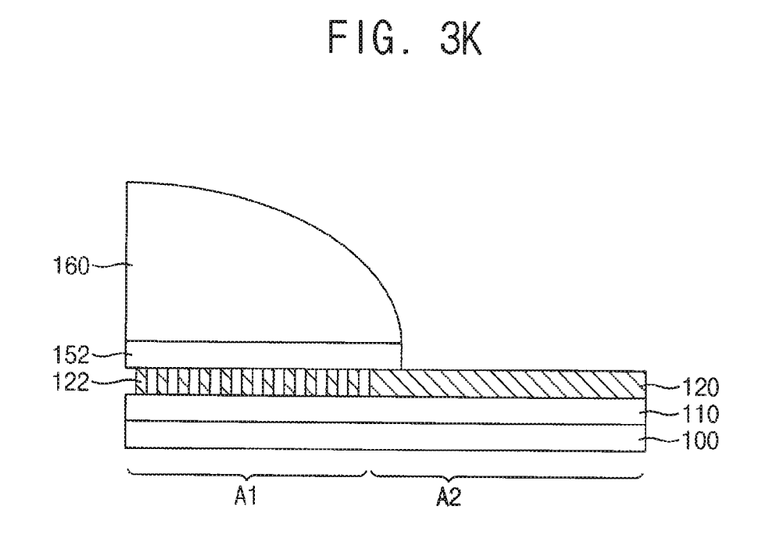

Referring to FIG. 3K, a second mask pattern 152 may be formed by patterning the second mask layer 150 using the second photoresist pattern 160. Accordingly, the first layer 120 may be exposed in the second area A2, and the pattern layer 122 may be covered by the second mask pattern 152 in the first area A1.

Figure 3L:
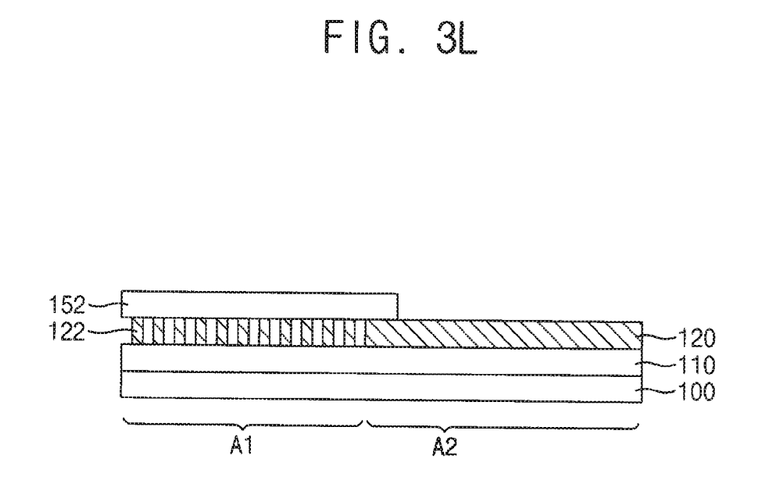

Referring to FIG. 3L, the second photoresist pattern 160 may be removed.

Figure 3M:
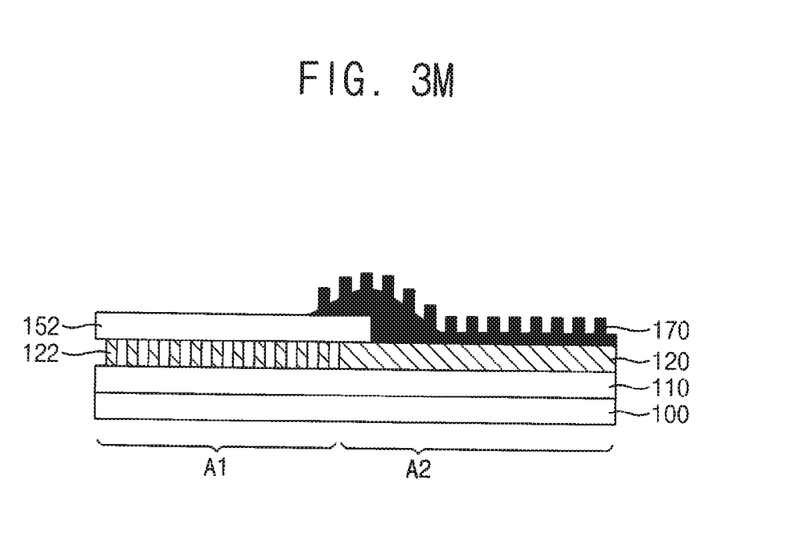

Referring to FIG. 3M, a preliminary second resin pattern 170 may be disposed on the first layer 120 in the second area A2. The preliminary second resin pattern 170 may be further disposed in at least a portion of the first area A1 adjacent to the second area A2. Thus, the preliminary second resin pattern 170 may also be disposed on the second mask pattern 152 in an edge portion of the first area A1 adjacent to the second area A2.

A resin layer may be disposed on the first layer 120 in the second area A2. And then, the resin layer may be pressed by an imprint mold. And then, the resin layer may be cured to form the preliminary second resin pattern 170. The preliminary second resin pattern 170 may be formed using the same method used for the preliminary first resin pattern 140.

Figure 3N:
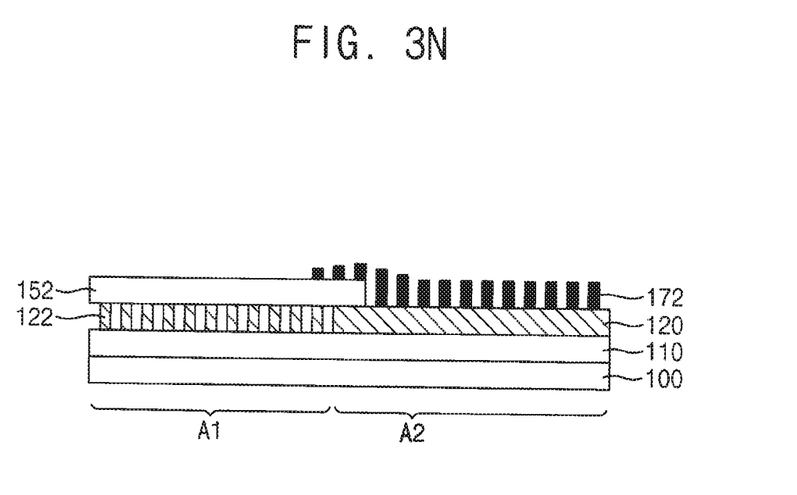

Referring to FIG. 3N, a residual layer of the preliminary second resin pattern 170 may be removed to form a second resin pattern 172. For example, the preliminary second resin pattern 170 may be wet etched or dry etched to remove the residual layer.

Figure 3O:
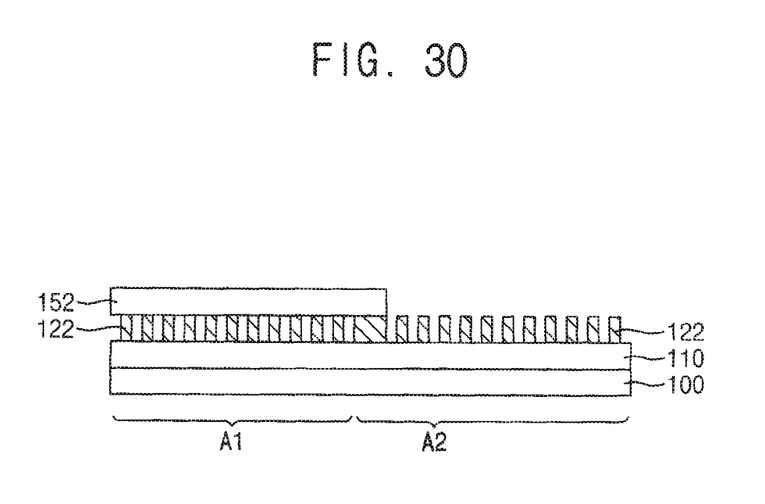

Referring to FIG. 3O, the first layer 120 may be patterned using the second mask pattern 152 and the second resin pattern 172. For example, the first layer 120 may be etched using the second mask pattern 152 and the second resin pattern 172 as an etching barrier. Accordingly, a pattern layer 122 may be disposed in the second area A2.

And then, remaining portions of the second resin pattern 172 may be removed.

Figure 3P:
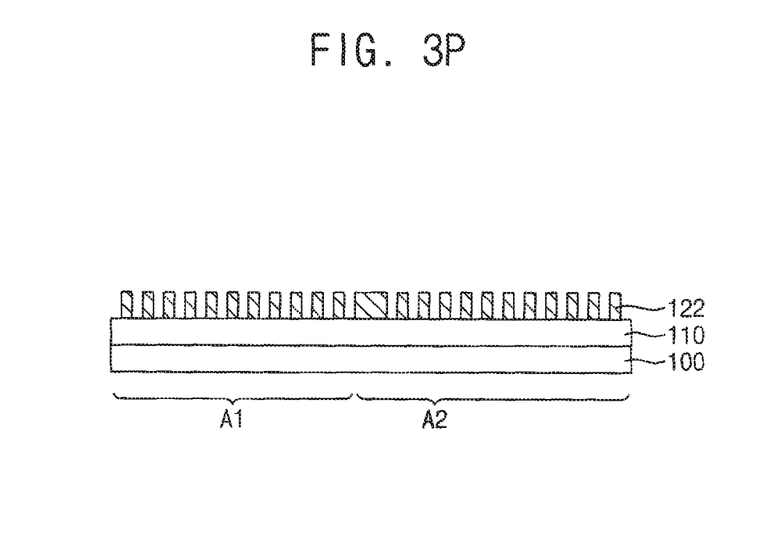

Referring to FIG. 3P, the second mask pattern 152 may be removed. Accordingly, the pattern layer 122 in the first area A1 may be exposed.

The pattern layer 122 may have a formation error at a boundary between the first area A1 and the second area A2. However, the formation error may be imperceptible to the human eye as described in FIG. 3J.

Figure 3Q:
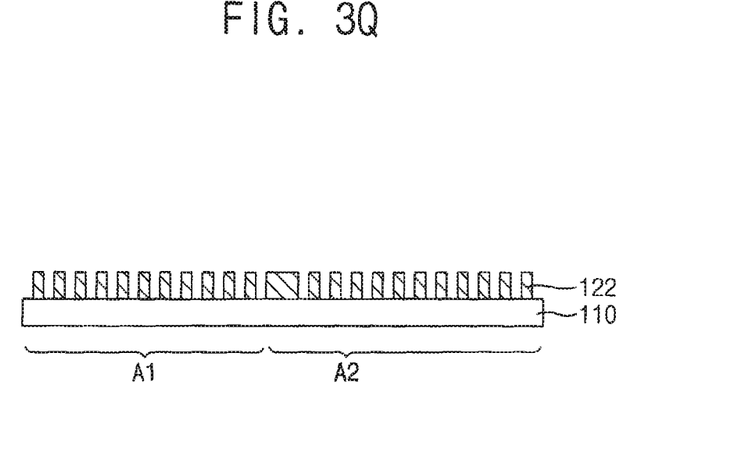

Referring to FIG. 3Q, the substrate 100 may be separated from the base layer 110. For example, using a laser, the base layer 110 may be peeled off from the substrate 100. Accordingly, the base layer 110 having the pattern layer 122 may be attached to the surface 12 of the roll body 10 to manufacture the roll type imprint master mold of FIGS. 1 and 2, according to an exemplary embodiment.

The base layer 110 is flexible, and the pattern layer 122 includes an inorganic insulation material having sufficient strength. Therefore, the roll type imprint master mold may be manufactured by attaching the base layer 110 having the pattern layer 122 on the roll body 10.

Figure 5:
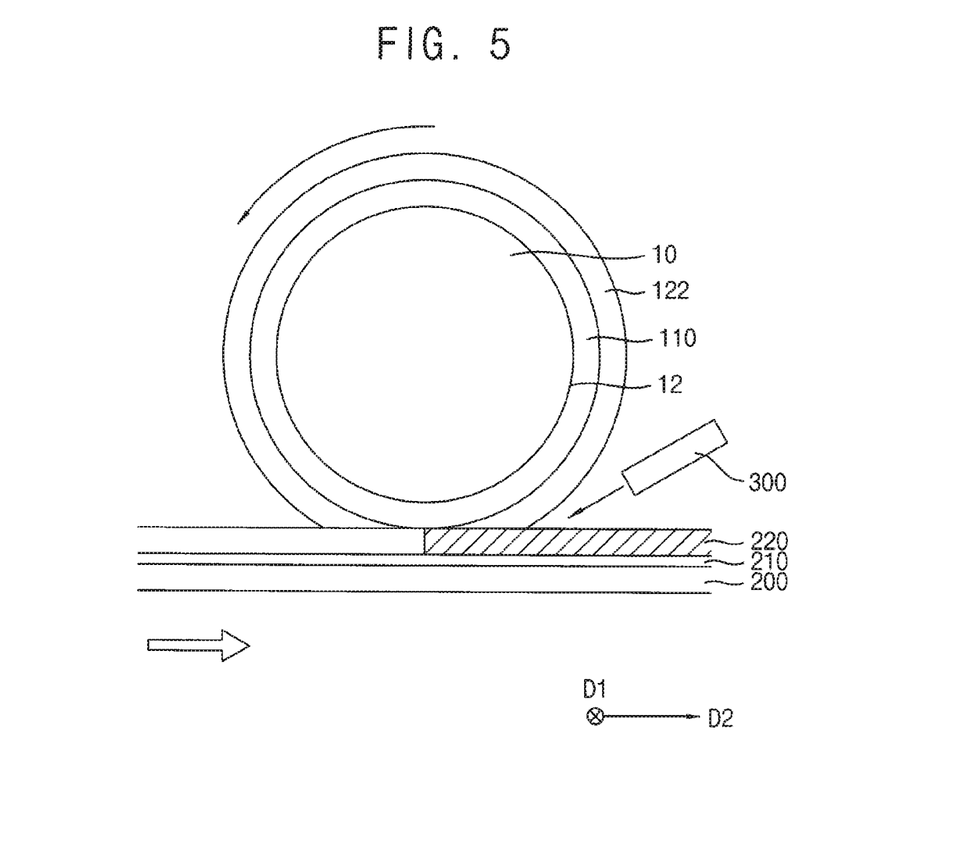
FIG. 5 is a cross-sectional view illustrating an imprint method using the roll type imprint master mold of FIG. 1, according to an exemplary embodiment.

FIG. 5 is a cross-sectional view illustrating an imprint method using the roll type imprint master mold of FIG. 1, according to an exemplary embodiment.

Referring to FIG. 5, a first layer 210 may be disposed on a substrate 200. The first layer 210 may be formed of metal. The first layer 210 may be used to form the wire grid polarizer of a display apparatus. For example, the first layer 120 may include aluminum. An imprint resin layer 220 may be disposed on the first layer 210. The imprint resin layer 220 may include photocurable resin.

The imprint resin layer 220 may be pressed using the roll type imprint master mold. Accordingly, the pattern layer 122 of the roll type imprint master mold may be imprinted onto the imprint resin layer 220, so that an imprint resin pattern may be formed in the imprint resin layer 220. Here, the roll type imprint master mold may be rotated and rolled on the substrate 200 while moving the substrate 200 in a second direction D2.

An ultraviolet irradiator 300 may radiate ultraviolet ray to the imprint resin layer 220 on which the pattern layer 122 is imprinted, and hardening the imprint resin layer 220. The ultraviolet irradiator 300 may radiate the ultraviolet ray to a portion of the imprint resin layer 220 to where the roll type imprint master mold is contacted. Accordingly, the imprint resin layer 220 including the photocurable resin may be hardened.

Here, a surface 12 of the roll body 10 of the roll type imprint master mold may be formed of a metal having high reflectance such as aluminum, and the first layer 210 may be formed of a metal such as aluminum. In addition, the pattern layer 122 and/or the imprint resin layer 220 may transmit through light.

Thus, the ultraviolet ray generated from the ultraviolet irradiator 300 passes the pattern layer 122 and is reflected on the surface 12 of the roll body 10, and then the light passes the imprint resin layer 220 and is reflected on the first layer 210, so that the imprint resin layer 220 may be efficiently hardened.

According to the exemplary embodiments, the roll type imprint master mold includes the inorganic insulation material, so that durability of the roll type imprint master mold may be improved compared to a conventional imprint mold formed of resin. In addition, the roll type imprint master mold is directly imprinted on the display substrate without an additional film mold according to the imprint method using the roll type imprint master mold, so that process will be simplified compared to a conventional method which includes forming a film mold using an imprint mold and transferring the film mold to the display substrate.

In addition, the surface of the roll body of the roll type imprint master mold is formed of a metal having high reflectance such as aluminum, and the first layer disposed under the imprint resin layer is also formed of a metal, so that radiation efficiency of the ultraviolet ray for hardening the imprint resin layer may be improved.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:
1. A method of manufacturing an imprint master mold, comprising:

disposing a base layer on a substrate, the substrate comprising a first area and a second area adjacent to the first area;

disposing an inorganic insulation layer on the base layer;

forming a first mask pattern on the inorganic insulation layer in the second area;

forming a first resin pattern on the inorganic insulation layer in the first area;

forming a pattern layer in the first area by etching the inorganic insulation layer using the first resin pattern and the first mask pattern as a mask;

removing the first resin pattern and the first mask pattern;

forming a second mask pattern on the inorganic insulation layer in the first area and in at least a part of the second area adjacent to the first area;

forming a second resin pattern on the inorganic insulation layer in the second area;

forming a pattern layer in the second area by etching the inorganic insulation layer using the second resin pattern and the second mask pattern as a mask;

removing the second resin pattern and the second mask pattern;

separating the base layer from the substrate; and attaching the base layer on which the pattern layer is formed onto a body of the imprint master mold.

2. The method of claim 1, wherein forming the first resin pattern comprises:

disposing a first resin layer on the inorganic insulation layer in the first area; and forming the first resin pattern from the first resin layer using an imprint mold.

3. The method of claim 2, wherein forming the first mask pattern comprises:

disposing a first mask layer on the inorganic insulation layer;

disposing a first photoresist pattern on the first mask layer in the second area; and removing a portion of the first mask layer corresponding to the first area by etching the first mask layer using the first photoresist pattern as a mask.

4. The method of claim 3, wherein forming the second resin pattern comprises:

disposing a second resin layer on the inorganic insulation layer in the second area; and forming the second resin pattern from the second resin layer using the imprint mold.

5. The method of claim 4, wherein forming the second mask pattern comprises:

disposing a second mask layer on the inorganic insulation layer;

disposing a second photoresist pattern on the second mask layer in the first area and in at least a part of the second area adjacent to the first area; and removing a portion of the second mask layer corresponding to the second area by etching the second mask layer using the second photoresist pattern as a mask.

6. The method of claim 1, wherein the body has a cylindrical shape, and attaching the base layer comprises attaching the base layer onto an adhesive layer disposed between the body and the base layer.

7. The method of claim 3, wherein the inorganic insulation layer comprises at least one selected from a group consisting of a silicon oxide (SiOx), silcononitrile (SiNx), and silicon oxynitride (SiON).

8. The method of claim 7, wherein the base layer comprises polyimide (PI) or polyamide (PA).

9. The method of claim 6, wherein the base layer comprises a transparent material, and a surface of the body is formed of a metal, on which the base layer is disposed.

* * * * *